United States Patent [19]

Aoki

[11] Patent Number: 4,662,312

[45] Date of Patent: May 5, 1987

[54] APPARATUS FOR ION AND VAPOR DEPOSITION

[75] Inventor: Masahiko Aoki, Kyoto, Japan

[73] Assignee: Nissin Electric Co., Ltd., Kyoto, Japan

[21] Appl. No.: 812,019

[22] Filed: Dec. 23, 1985

[30] Foreign Application Priority Data

Dec. 28, 1984 [JP] Japan .................. 59-279239

[51] Int. Cl.⁴ ............................................. B05C 11/00
[52] U.S. Cl. ..................................... 118/688; 118/715
[58] Field of Search ................................. 118/688, 715

[56] References Cited

U.S. PATENT DOCUMENTS 4,559,901 12/1985 Morimoto et al. ............... 427/38 X

OTHER PUBLICATIONS

Andoh et al., "A New Machine for Film Formation by Ion and Vapour Deposition", Ion Implantation Equipement & Techniques, Nuclear Instruments and Methods in Physics Research, B6 (1985), pp. 111-115, North-Holland, Amsterdam.

Primary Examiner—Bernard D. Pianalto
Attorney, Agent, or Firm—Sandler & Greenblum

[57] ABSTRACT

An apparatus for ion and vapor deposition comprises an ion implantation assembly including an ion source, a power supply for the ion source and an accelerator-injector for implanting ions from the ion source, a film forming assembly including an evaporation source and a power supply for the evaporation source, and a control assembly for controlling the two assemblies. The control assembly comprises means for maintaining ion implantation and vapor deposition in a specified ratio at all times when ion implantation and vapor deposition are effected at the same time and, which assures that ion implantation and vapor deposition are effected at the same time in a specified ratio to form a thin film of good quality and strong adhesion.

10 Claims, 3 Drawing Figures

APPARATUS FOR ION AND VAPOR DEPOSITION

BACKGROUND OF THE INVENTION

1. Field of the Invention

The present invention relates to improvements in apparatus for ion and vapor deposition to form a thin film on the surfaces of articles.

2. Description of the Prior Art

It has already been known to form a thin film on the surfaces of various articles, such as tools and rollers, to give the surface improved corrosion resistance and enhanced hardness.

Generally known as processes for forming such a thin film are vacuum evaporation, sputtering, etc. Although these processes achieve a high deposition rate, the film formed is not satisfactory in adhesion.

A process comprising ion implantation and vapor deposition in combination has recently been developed which is satisfactory in both the adhesion of the resulting film and the deposition rate.

In actuality, however, this ion and vapor deposition process still remains to be improved in the adhesion of film. For the ion and vapor deposition process to form a film of fully satisfactory adhesion, it is desirable to simultaneously effect ion implantation and vapor deposition in a specified ratio in the initial film forming stage, whereas the apparatus commercially available at present have difficulty in effecting ion implantation and vapor deposition properly at the same time in the specified ratio.

It has recently been found that ion implantation and vapor deposition, when effected at the same time in the specified ratio, produce an effect to give an improved quality (crystallinity) to the film itself and also during the subsequent film forming stage following the initial stage.

Further, films having good quality and satisfactory adhesion are desired as the inter-layer insulation films and electrode wiring films to be formed in large-scale integrated circuits (LSI's).

SUMMARY OF THE INVENTION

The present invention provides an apparatus for ion and vapor deposition comprising an ion implantation assembly including an ion source, a power supply for the ion source and an accelerator-injector for implanting ions from the ion source; a film forming assembly including an evaporation source and a power supply for the evaporation source; and a control assembly for controlling the film forming and ion implantation assemblies, the control assembly comprising means for maintaining ion implantation and vapor deposition in a specified ratio at all times when ion implantation and vapor deposition are effected at the same time.

An object of the present invention is to provide an apparatus for ion and vapor deposition for assuring that ion implantation and vapor deposition will be effected at the same time in a specified ratio.

Another object of the present invention is to form a thin film of good quality and strong adhesion on the surface of a substrate by ion implantation and vapor deposition.

DESCRIPTION OF THE PREFERRED EMBODIMENT

The basic construction of the apparatus of the invention will be described first.

The means according to the present invention for maintaining ion implantation and vapor deposition in a specified ratio functions such that ion implantation and vapor deposition, when effected at the same time, are accomplished in a specified ratio at all times. When the amount of ion implantation varies, the amount of deposition is varied and whereas if the amount of deposition varies, the amount of ion implantation is varied so as to maintain the two amounts in the specified ratio.

In practice, generally the ion beam current varies owing to discharge or the like to vary the amount of ion implantation. Accordingly, the specified ratio maintaining means of the present invention is, for example, means for correcting the deposition rate of the evaporation source in accordance with variations in the ion beam current. When the ion beam current varies for one reason or another, the correction means measures the variation and corrects the deposition rate based on the measurement, i.e., increases the deposition rate if the variation is an increase or decreases the deposition rate if the variation is a decrease.

For example, the correction means feeds to the power supply for the evaporation source a corrected deposition rate signal ES' representing ES·(I/Io), which is obtained by multiplying the variation ratio of the ion beam current, I/Io (Io: specified current, I: varied current), by a predetermined deposition rate ES.

The correction means comprises a measuring device for measuring the ion beam current, and a correction circuit for feeding the corrected deposition rate signal to the evaporation source power supply based on the current signal from the measuring device. An ammeter having the function of delivering current signals to the correction circuit is used as the measuring device. The ammeter used for integrating current required for controlling ion implantation may also be used as the above-mentioned ammeter. The correction circuit may be of usual construction comprising an interface unit, an A/D conversion unit, a digital signal processing unit including sampling circuits, a calculation circuit, etc., and a D/A conversion unit.

The ion implantation assembly and the (vapor deposition) film forming assembly constituting the present apparatus may be those generally used. The ion implantation means may be provided with a mass analysing system for implanting the required ion only. The film forming assembly may include an electron beam evaporation source, resistance heating evaporation source, a high-frequency heating evaporation source or a like suitable one as its evaporation source.

While the present invention will be described below in greater detail with reference to an embodiment and the accomanying drawings, the invention is not limited to that embodiment.

Figure 1:
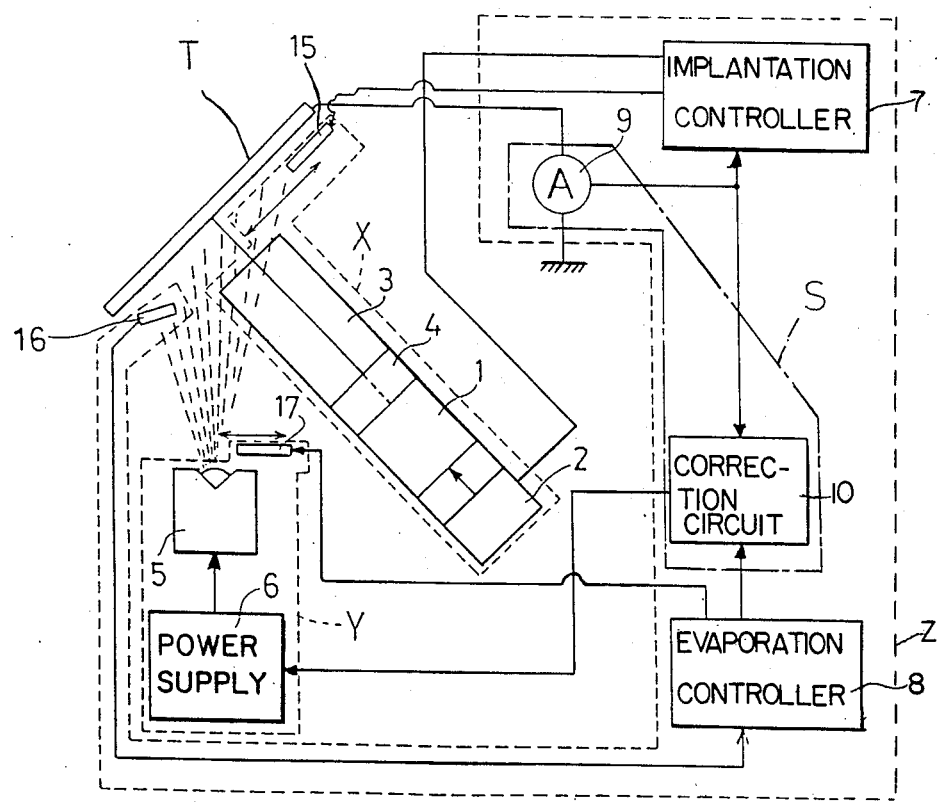
FIG. 1 is a block diagram showing an apparatus for ion and vapor deposition embodying the present invention.

FIG. 1 shows an ion implantation assembly X, a vapor deposition film forming assembly Y, a control assembly Z for the two assemblies X, Y, and a substrate T on which a film is to be formed by ion and vapor deposition.

The ion implantation assembly X consists essentially of an ion source 1, a power supply 2, and an accelerator-injector 3 for accelerating and implanting ions from the ion source 1 into the substrate T. When required, a mass analysing system 4 is used by which only the desired ion is selectively caused to impinge upon the substrate T.

The film forming assembly Y consists essentially of an evaporation source 5 and a heating power supply 6 for the evaporation source 5. Examples of useful evaporation sources are electron beam evaporation sources, resistance heating evaporation sources, high-frequency heating evaporation sources etc. The power supply 6 is one suited to the source selected. When an electron beam evaporation source is used, the power supply 6 for the evaporation source is an electron gun power supply.

The control assembly Z consists essentially of an implantation controller 7 and an evaporation controller 8, which are electrically connected to the power supplies 2 and 6 of the assemblies X and Y, a measuring device 9 and a correction circuit 10 which constitutes the correction means (means for maintaining ion implantation and vapor deposition in a specified ratio) S of the invention. The measuring device 9 is electrically connected to the substrate T for measuring the ion beam current and is, for example, an ammeter. The correction circuit 10 may be incorporated in the evaporation controller 8.

Figure 2:
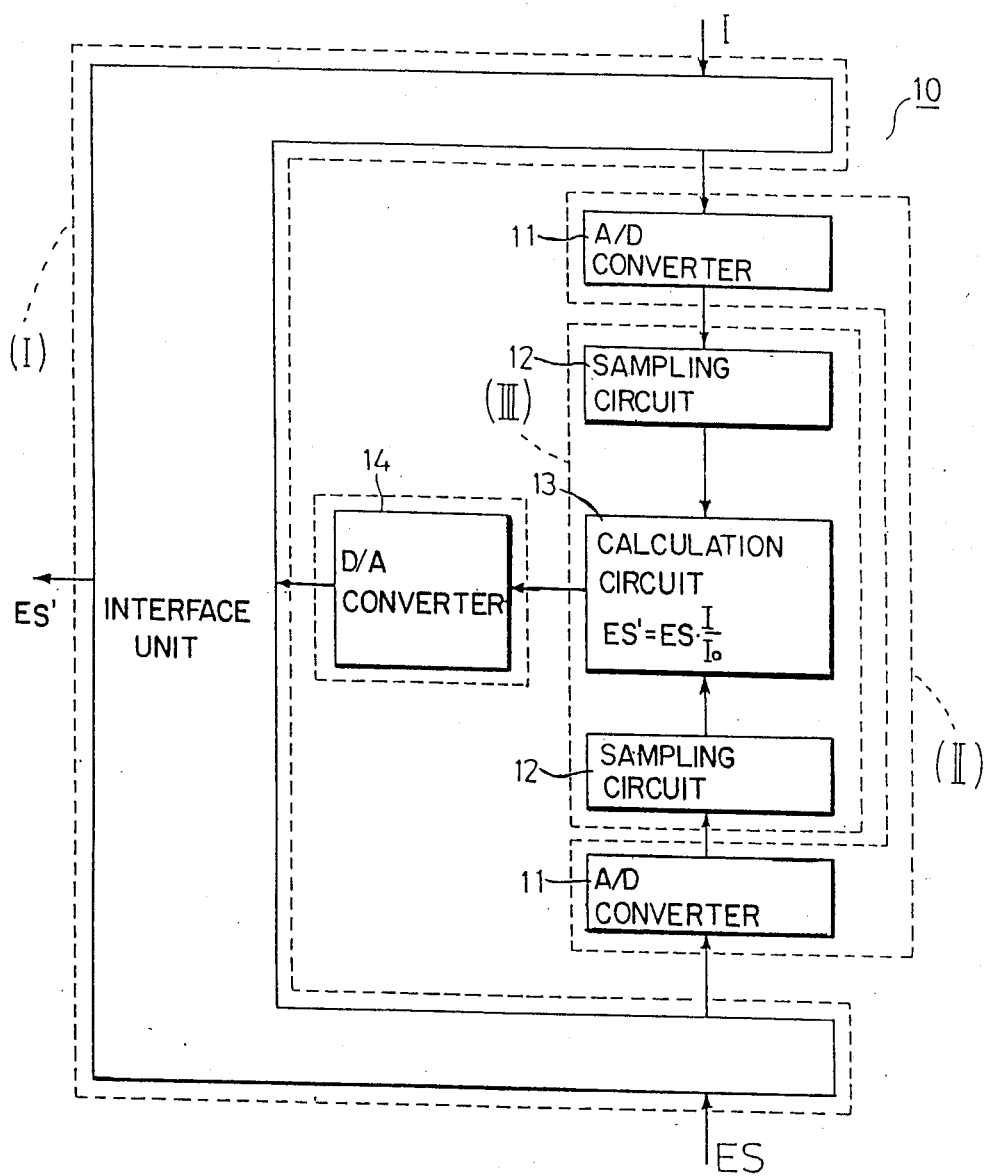
FIG. 2 is a block diagram showing a correction circuit.

As shown in FIG. 2, the correction circuit 10 constituting the correction means S which characterizes the present invention comprises an interface unit I for receiving and delivering signals, an A/D conversion unit II, a digital signal processing unit III, and a D/A conversion unit IV. The A/D conversion unit II comprises A/D converters 11, 11. The digital signal processing unit III comprises sampling circuits 12, 12 and a calculation circuit 13. The D/A conversion unit IV comprises a D/A converter 14.

The correction circuit 10 provides a control signal ES' in the following manner.

The measuring device 9 measures current I and delivers an analog signal, while the evaporation controller 8 emits an analog control signal ES. These signals are fed to the A/D converters 11, 11, respectively, and converted to digital signals, which are sampled by the sampling circuits 12, 12 at a given time interval. The sampled signals are fed to the calculation circuit 13, in which the current I is divided by a set current Io, and the resulting value I/Io is multiplied by the set control signals ES to obtain $ES' = ES \cdot (I/Io)$. The signal ES' is fed to the D/A converter 14, which in turn delivers an analog signal on conversion.

The deposition rate E is basically in proportion to the deposition rate signal ES, and the constant of proportion may be set suitably.

The operation of the present apparatus will be described below, first generally.

The current I of the ion beam irradiating the substrate T is measured by the measuring device 9, and the implantation controller 7 integrates the beam current I, whereby the amount of irradiation of the substrate T is determined. When a predetermined dose is reached, a beam shutter 15 is closed. In this manner, the amount of irradiation of the substrate T with the ion (i.e., amount of ion implantation) is controlled.

On the other hand, the evaporation controller 8 gives a control signal ES (or ES') to the power supply 6 via the correction circuit 10 to vary the emission (amount of electron beam to be emitted) by the electron gun (not shown) of the evaporation source 5 and to control the rate of deposition E (angstroms/min) of the substance evaporated from the source 5 to a predetermined level. In this case, the actual deposition rate E is detected by a film thickness sensor 16 which is disposed in the vicinity of the substrate T and which feeds back a film thickness signal TS to the evaporation controller 8. When the amount of deposition on the substrate T has reached a specified value, a vapor shutter 17 is closed. In this way, the amount of deposition on the substrate T is controller.

Before the start of irradiation with ions and vapor deposition (i.e. until time t2, see FIG. 3), the beam current I and the deposition rate E are controlled independently of each other. (During this period, the correction circuit 10 is adapted, for example, to feed the control signal ES from the evaporation controller 8 directly to the electron gun power supply 6.) Thus, the deposition rate E is raised to the desired initial set value Eo, and for a given period of time after the initial setting Eo has been reached (e.g., from time t1 to t2), the apparatus is allowed to stand to remove gas from the substance to be evaporated by the evaporation source 5. The beam shutter 15 and the vapor shutter 17 are still held closed at this time. In the meantime, the desired initial set value Io of the beam current is made available, for example, by measuring the current at the beam shutter 15.

The deposition rate E is corrected as follows, according to variations in the ion beam current I.

Figure 3:
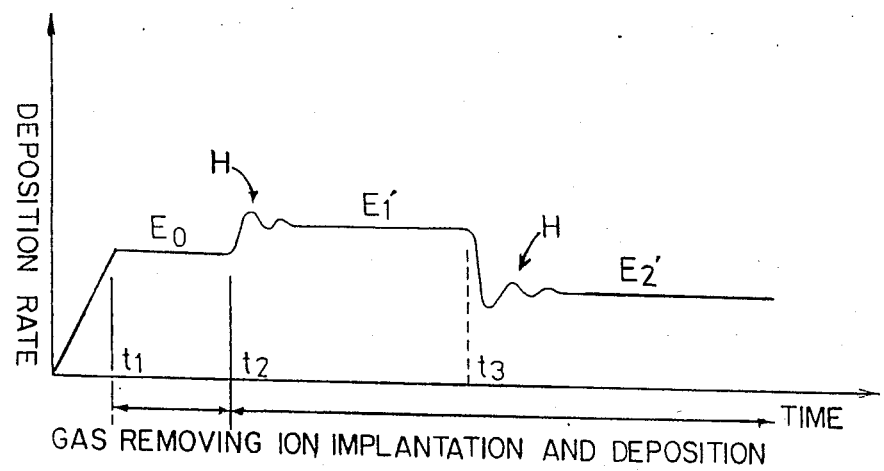
FIG. 3 is a graph showing variations in the deposition rate as determined using the apparatus of the invention.

At time t2, the beam shutter 15 and the vapor shutter 17 are opened to start irradiation with ion and vapor deposition at the same time. The correction circuit 10 thereafter functions, such that if the beam current I measured at the substrate T differs from the initial setting Io, the deposition rate is corrected, for example, to E1' in accordance with the difference. The symbol H in FIG. 3 represents hunting which usually occurs in the control circuit.

Further when the beam current I varies for one cause or another during irradiation and vapor deposition, for example, at time t3, the deposition rate is corrected, for example, to E2' in accordance with the variation.

Given below are two examples in which films were formed using the present apparatus.

1. Substrate: SUS
   Substance evaporated: Ti (deposition rate 1 Å/sec)
   Ion species: N (implantation voltage 10 kV, beam current 10 mA)
   Time required: 1 hour
   The product obtained was an abrasion-resistant plate coated with a tiN film having a thickness of 3000 Å.

2. Substrate: Si
   Substance evaporated: Si (deposition rate 50 Å/sec)
   Ion species: N (implantation voltage 10 kV, beam current 10 mA)
   Time required: 10 minutes
   The product obtained was an abrasion-resistant plate coated with an $Si_3N_4$ film having a thickness of 500 Å. In this example, a bird's beak inhibition effect was observed owing to selective oxidation. Advantages of the Invention According to the present invention, ion implantation and vapor deposition are simultaneously effected in a specified ratio at all times, giving films of improved properties including satisfactory adhesion.

What is claimed is:

1. An apparatus for ion implantation and vapor deposition, comprising:
    an ion implantation assembly including an ion source;
    a power supply for the ion source and an accelerator-injector for implanting ions from the ion source;
    a vapor deposition film forming assembly including an evaporation source and a power supply for the evaporation source said vapor deposition film forming assembly being separately operable from said ion implantation assembly; and
    a control assembly comprising means for independently controlling the ion implantation assembly and the film forming assembly, the control assembly comprising means for maintaining the ion implantation and vapor deposition in a specified ratio at all times when the ion implantation and vapor deposition are effected simultaneously.

2. An apparatus as defined in claim 1, wherein the means for maintaining said ion implantation and said vapor deposition in a specified ratio comprises correction means for correcting a deposition rate of the evaporation source according to variations in the ion beam current emitted by the ion source.

3. An apparatus as defined in claim 2, wherein the correction means comprises a measuring device for measuring variations in the ion beam current, and a correction circuit for feeding a corrected deposition rate signal to the power supply of the evaporation source in response to a current signal received from the measuring device.

4. An apparatus as defined in claim 3, wherein the measuring device is an ammeter.

5. An apparatus as defined in claim 3, wherein the correction circuit comprises an interface unit for receiving and delivering signals, an A/D conversion unit, a digital signal processing unit and a D/A conversion unit.

6. An apparatus as defined in claim 3, wherein the corrected deposition rate signal ES' produced from the correction circuit represents $ES \cdot (I/I_o)$ wherein $I_o$ is a predetermined value of the ion beam current, $I$ is a varied value of the current, and $ES$ is a predetermined deposition rate signal.

7. An apparatus as defined in claim 1, wherein the ion implantation assembly further comprises a mass analyzing system.

8. An apparatus as defined in claim 1, wherein the evaporation source of the film forming assembly comprises an electron beam evaporation source 9. An apparatus as defined in claim 1, wherein the evaporation source of the film forming assembly comprises a resistance heating evaporation source.

10. An apparatus as defined in claim 1, wherein the evaporation source of the film forming assembly comprises a high-frequency heating evaporation source.

* * * * *

UNITED STATES PATENT AND TRADEMARK OFFICE
CERTIFICATE OF CORRECTION

PATENT NO. : 4,662,312
DATED : May 5, 1987
INVENTOR(S) : M. AOKI

It is certified that error appears in the above-identified patent and that said Letters Patent is hereby corrected as shown below:

In the Abstract, line 11 of the printed patent, change "time and," to ---time, and---.

At column 4, line 57 of the printed patent, change "tiM" to ---TiM---.

At column 6, line 14 of the printed patent, change "$(I/I_o)$" to ---$(I/I_o)$,---.

Signed and Sealed this

Twenty-ninth Day of December, 1987

Attest:

DONALD J. QUIGG

*Attesting Officer*  *Commissioner of Patents and Trademarks*